United States Patent [19]
Tu et al.

[11] Patent Number: 6,096,653
[45] Date of Patent: Aug. 1, 2000

[54] METHOD FOR FABRICATING CONDUCTING LINES WITH A HIGH TOPOGRAPHY HEIGHT

[75] Inventors: Yeur-Luen Tu, Taichung; Kung Linliu, Hsinchu, both of Taiwan

[73] Assignee: Worldwide Semiconductor Manufacturing Corporation, Hsinchu, Taiwan

[21] Appl. No.: 09/206,780

[22] Filed: Dec. 7, 1998

[51] Int. Cl.[7] .................................................. H01L 21/302
[52] U.S. Cl. ...................... 438/697; 438/624; 438/636; 438/736; 438/738; 430/5
[58] Field of Search ................................. 438/697, 703, 438/736, 738, 725, 624, 636; 430/5

[56] References Cited

U.S. PATENT DOCUMENTS

| | | | |
|---|---|---|---|
| 5,264,076 | 11/1993 | Cuthbert et al. | 156/657 |
| 5,438,006 | 8/1995 | Chang et al. | 437/40 |
| 5,545,588 | 8/1996 | Yoo | 437/187 |
| 5,723,380 | 3/1998 | Wang | 438/624 |
| 5,885,902 | 3/1999 | Blasingame et al. | 438/738 |

*Primary Examiner*—William Powell
*Assistant Examiner*—George Goudreau
*Attorney, Agent, or Firm*—Blakely, Sokoloff, Taylor & Zafman LLP

[57] ABSTRACT

A method for forming a metal interconnect structure over a high topography dielectric is disclosed. The method comprises the steps of: depositing a conductive layer over the high topography dielectric layer; depositing a planarized oxide layer over the conducting layer, patterning and etching the planarized oxide layer in accordance with a desired metal interconnect pattern using the conducting layer as an etching stop; using the planarized oxide layer as a hard mask, etching the conducting layer in accordance with the desired metal interconnect pattern imparted onto the planarized oxide layer; and depositing a gap-filling oxide layer over the planarized oxide layer and the high topography dielectric layer.

4 Claims, 3 Drawing Sheets

METHOD FOR FABRICATING CONDUCTING LINES WITH A HIGH TOPOGRAPHY HEIGHT

FIELD OF THE INVENTION

The present invention relates to metal interconnect structures, and more particularly, to an improved method of forming metal interconnect structures extending over a highly non-planar surface.

BACKGROUND OF THE INVENTION

Metal interconnect structures are an important part of VLSI integrated circuits. The metal interconnect structures typically include metal lines and vias. The vias are used to interconnect the metal lines with conductive structures above and below the metal interconnect layer. The metal lines are also referred to as conductive lines. Sophisticated ICs may include several layers of metal interconnect structutes. The metal lines are commonly used on VLSI integrated circuits for carrying digital signals, analog signals, or bias power to and from the imbedded semiconductor devices.

The process of forming a metal interconnect structure begins with forming conductive plugs in an underlying dielectric layer. Next, a blanket deposition of a conductive material, such as aluminum, copper, or polysilicon is deposited over the conductive plugs and dielectric layer. Then, a photoresist layer is deposited over the metal layer. The photoresist layer is patterned and developed in accordance with the predetermined metal interconnect pattern. The developed photoresist layer is used as a mask for etching of the underlying metal layer.

This prior art method of patterning and etching a conductive metal layer is satisfactory where the underlying dielectric layer is relatively planar. However, as integrated circuits become more sophisticated and larger numbers of layers are stacked atop each other, the planarity of the underlying dielectric layer becomes unsatisfactory. Indeed, the difference between the top of the dielectric layer and a valley of the dielectric layer may be as much as 4,000–8,000 angstroms especially in the case of DRAM manufacture. The variance in topography presents significant etching difficulties where a photoresist layer is placed directly onto a metal layer. Specifically, when a metal layer is deposited onto the high topography dielectric layer, the metal layer tends to conform to the shape of the underlying dielectric layer. This causes the conductive metal layer to also have high topography variance and requires higher over etching. The high topography height dramatically increases difficulty in the photolithography process due to poor depth of focus.

As devices are shrinking down, deep ultraviolet (DUV) lithography is employed and the thickness of the DUV photoresist layer that is used to pattern the conducting layer is also reduced in order to improve photolithography resolution. However, this approach is also problematical because the etching selectivity of metal to photoresist is generally less than 2:1.

Therefore, what is needed is a method of etching conductive lines that lie atop a highly non-planar dielectric layer.

SUMMARY OF THE INVENTION

A method for forming a metal interconnect structure over a high topography dielectric is disclosed. The method comprises the steps of: depositing a conductive layer over said high topography dielectric layer; depositing and planarizing an oxide layer over said conducting layer; patterning and etching said planarized oxide layer in accordance with a desired metal interconnect pattern using said conducting layer as an etching stop; using said planarized oxide layer as a hard mask, etching said conducting layer in accordance with said desired metal interconnect pattern imparted onto said planarized oxide layer, and depositing a gap-filling oxide layer over said planarized oxide layer and said high topography dielectric layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
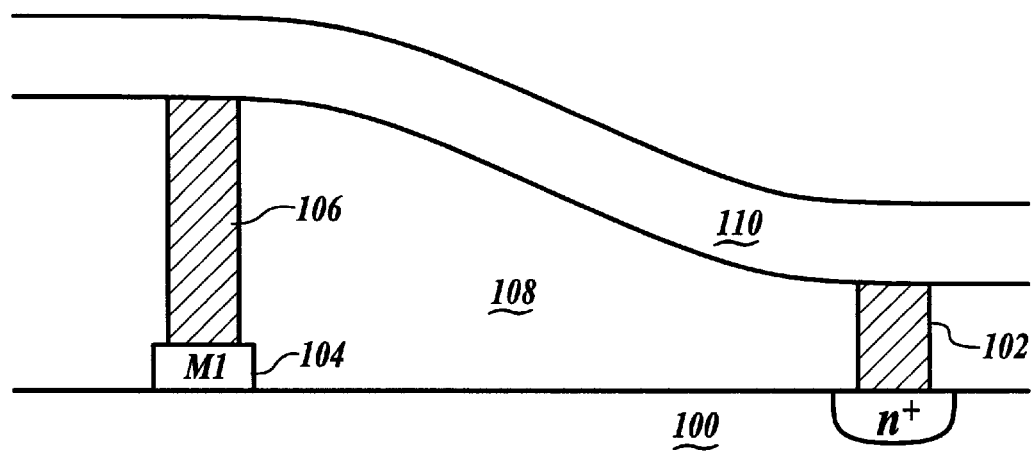
FIGS. 1–5 are cross-sectional views of a semiconductor substrate illustrating the method of etching conductive lines in accordance with the present invention.

Turning to FIG. 1, a semiconductor substrate 100 is shown. The substrate is understood to possibly include a semiconductor wafer, active and passive devices formed within the wafer, and layers formed on the wafer's surface. The term "substrate" is meant to include devices formed within a semiconductor wafer and the layers overlying the wafer. For example, the substrate may include conductive landing pads, conductive gates of transistors, and the like.

In the example shown in FIG. 1, the substrate includes an N+ well that may be the source or drain of a transistor. Atop the N+ well is a conductive plug 102 that is used for interconnecting the N+ well to a metal interconnect structure above the well. Also shown in FIG. 1 as an example of the types of devices that can be formed on the substrate is a metal line 104. The metal line 104 also is connected to a conductive plug 106 that is used for connecting the metal line 104 to a subsequent metal interconnect structure.

The metal line 104, the conductive plugs 102 and 106, and other structures are insulated by an interlayer dielectric (ILD) 108. The interlayer dielectric 108 may be formed of silicon oxide, borophosphosilicate glass (BPSG), tetraethylorthosilicate (TEOS) oxide, or any combination thereof Note also that in FIG. 1, there is a severe topography height difference between the top of the conducting plug 102 and the top of the conducting plug 106. As noted above, the non-planar characteristic of the interlayer dielectric 108 tends to render photolithography of the subsequent metal layer difficult.

Still referring to FIG. 1, a metal layer 110 is then deposited conformally over the interlayer dielectric 108 and over the conductive plugs 102 and 106. The metal layer 110 is typically 4,000–5,000 angstroms in thickness and is formed from aluminum, copper, polysilicon, or any other conducting material. The metal layer 110 is typically formed using conventional chemical vapor deposition (CVD) or physical sputtering techniques.

In conventional prior art methods of forming the metal interconnect structure, a photoresist layer would then be deposited atop the metal layer 110. The photoresist layer would be patterned in accordance with the desired interconnect pattern and the remaining photoresist would be used as a mask to etch the conducting metal layer 110. However, as noted above, because of the non-planarity of the metal layer 110, photolithography difficulties arise due to poor depth of focus. Moreover, the reduced photoresist thickness required to achieve better photolithography resolution also gives rise to difficulties in etching because significant overetching is required due to the non-planarity of the metal layer 110.

Figure 2:
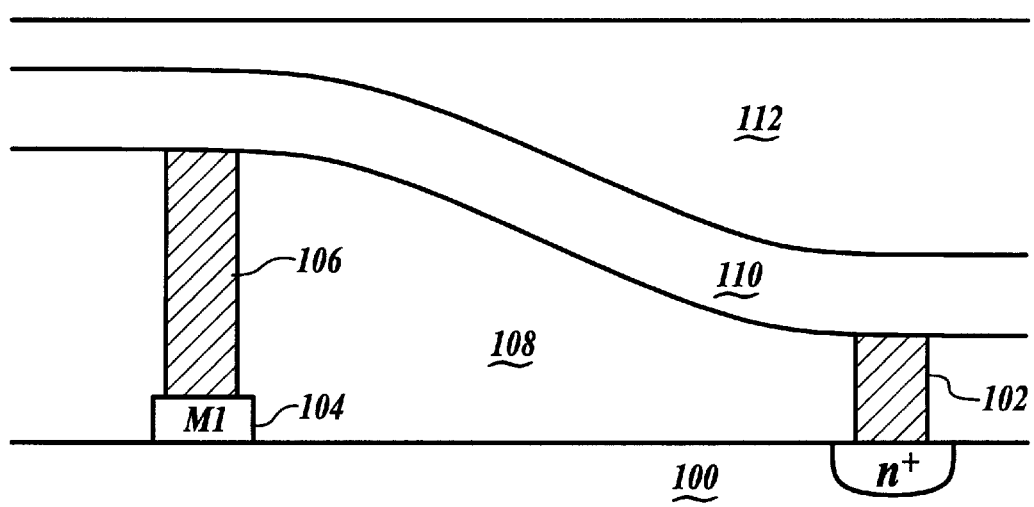

In accordance with the present invention, turning to FIG. 2, a planarized oxide layer 112 is formed over the metal layer 110. The planarized oxide layer 112 may be formed by any one of a number of conventional techniques. For example, the planarized oxide layer 112 may be formed using high density plasma CVD (HDPCVD) or spin on glass (SOG) followed by an etch back process. Alternatively, the spin on glass may be planarized using chemical mechanical polishing (CMP). Preferably, the planarized oxide layer 112 has a thickness of 4000–10000 angstroms at different topography levels.

Figure 3:
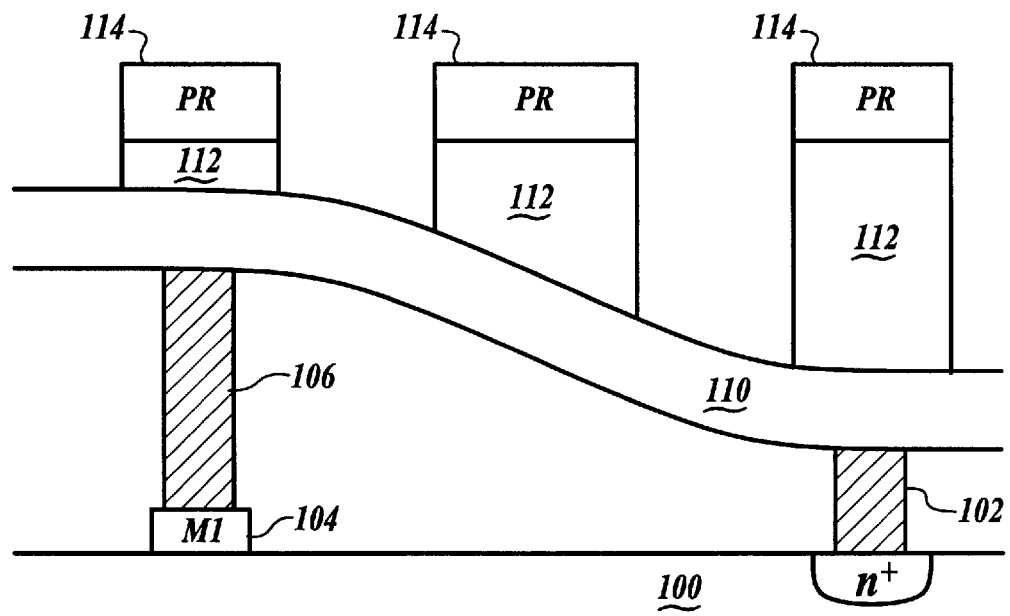

Next, as seen in FIG. 3, the planarized oxide layer 112 is patterned and etched using standard photolithography techniques to generate the metal interconnect pattern. Thus, the mask that would normally be used to etch the metal layer 110 in the prior art is instead used to etch the planarized oxide layer 112. In other words, the oxide layer 112 is patterned in accordance with the metal interconnect pattern and, as will be seen below, used as a hard mask to etch the metal layer 110.

Therefore, referring to FIG. 3, it is seen that a photoresist layer 114 contains an exemplary pattern for the metal interconnect structure. Note that the photoresist layer 114 will remain above the conducting plugs 106 and 102. This will allow for the metal layer 110 to remain above these plugs after etching. Further, it can be appreciated that the pattern shown in FIG. 3 is merely exemplary and should in no way be deemed to be limiting.

As seen in FIG. 3, the etching of the oxide layer 112 is performed until the metal layer 110 is reached. The etching of the oxide layer 112 can be easily controlled using conventional methods using the metal layer 110 as a stop layer. After the oxide layer 112 has been etched, the photoresist 114 is stripped and the planarized oxide layer 112 is used as a hard mask to etch the metal layer 110. It is noted that the etching selectivity of oxide to photoresist is approximately 4:1–6:1 and is better than the etching selectivity of metal to photoresist. Therefore, the etching of the oxide layer 112, which has a large thickness variance would be feasible using DUV photoresist thickness.

Figure 4:
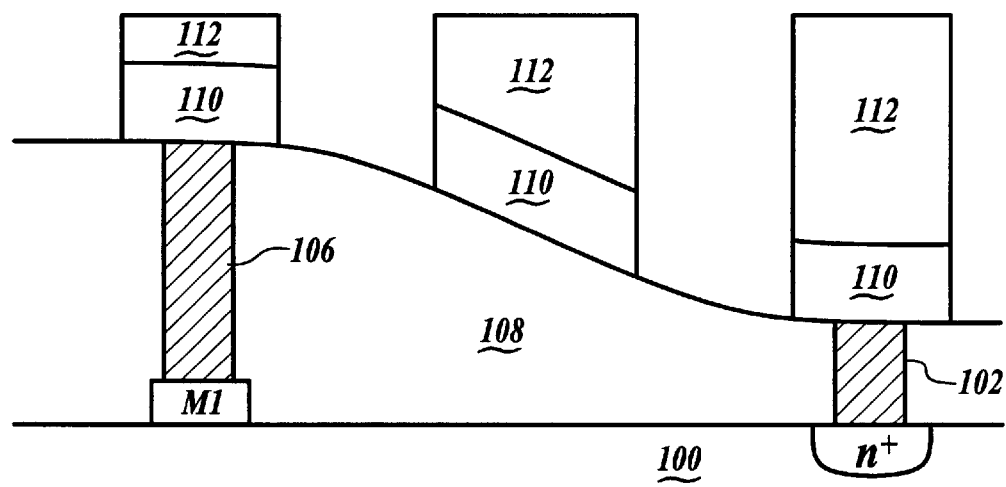

Therefore, turning to FIG. 4, a metal etching technique is used to etch the metal layer 110 using the planarized oxide layer 112 (what remains of it) as a hard mask. Note that heavy overetching may be needed and there may be up to 2,000 angstroms of oxide loss in the planarized oxide layer 112. The etching selectivity of metal to oxide is from 10:1 to 25:1 which is much higher compared to the etching selectivity of metal to photoresist.

Figure 5:
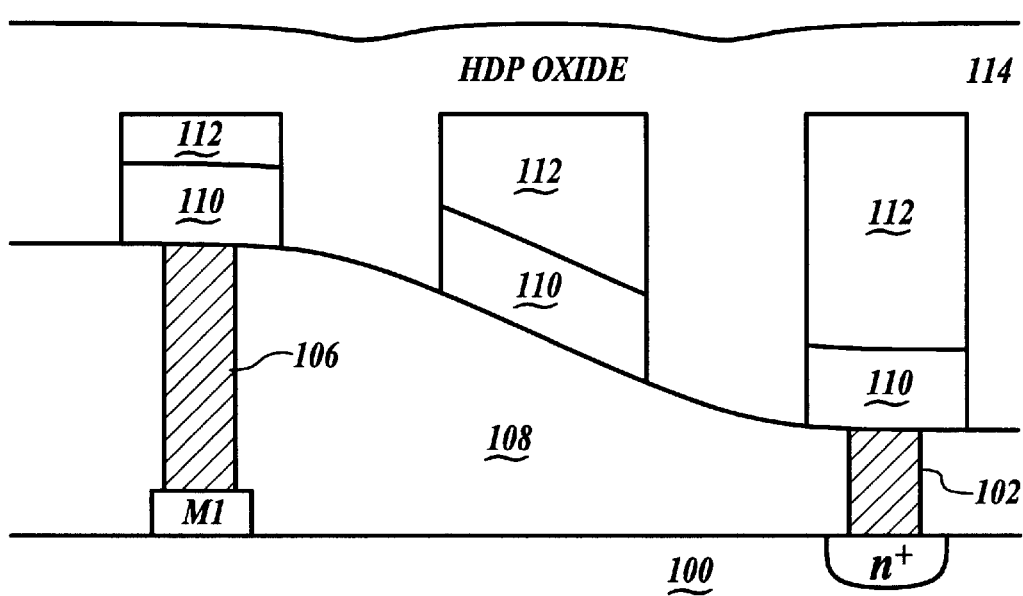

Finally, the last step of the present invention is to fill the gaps in the metal layer 110 by an insulating dielectric oxide. Preferably, high-density plasma CVD oxide or spin on glass may be used to perform the gap filling. It is believed that a 3:1 aspect ratio and 0.18 micron spacing between features can be filled using HDP CVD or spin on glass. Note that the use of the planarized oxide layer 112 as a hard mask provides a high etching selectivity between oxide and metal so that patterning and etching of conducting lines with a high topography height is feasible. The resulting structure is shown in FIG. 5 with the HDP oxide layer 114 shown planarizing the underlying structures.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for forming a metal interconnect structure over a dielectric layer comprising the steps of:
   depositing a conductive layer over said dielectric layer;
   depositing a planarized oxide layer over said conducting layer;
   patterning and etching said planarized oxide layer in accordance with a metal interconnect pattern using said conducting layer as an etching stop;
   using said planarized oxide layer as a hard mask, etching said conducting layer in accordance with said metal interconnect pattern imparted onto said planarized oxide layer; and
   depositing a gap-filling oxide layer over said planarized oxide layer and said dielectric layer.

2. The method of claim 1, wherein said conducting layer is chosen from the group of copper, aluminum, tungsten, or polysilicon.

3. The method of claim 1, wherein said photoresist layer is removed after the etching of said planarized oxide layer.

4. The method of claim 1, wherein said gap-filling oxide layer is formed from spin on glass or high-density plasma chemical vapor deposition oxide.

\* \* \* \* \*